US012813365B2

(12) United States Patent
Uzoh et al.

(10) Patent No.: US 12,813,365 B2
(45) Date of Patent: Nov. 24, 2026

(54) BONDED STRUCTURE AND METHOD OF FORMING SAME

(71) Applicant: ADEIA SEMICONDUCTOR BONDING TECHNOLOGIES INC., San Jose, CA (US)

(72) Inventors: Cyprian Emeka Uzoh, San Jose, CA (US); Thomas Workman, San Jose, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 423 days.

(21) Appl. No.: 18/461,372

(22) Filed: Sep. 5, 2023

(65) Prior Publication Data

US 2024/0105674 A1 Mar. 28, 2024

Related U.S. Application Data

(60) Provisional application No. 63/374,869, filed on Sep. 7, 2022.

(51) Int. Cl.
*H01L 23/48* (2006.01)
*H01L 23/52* (2006.01)
(Continued)

(52) U.S. Cl.
CPC ........... *H10W 99/00* (2026.01); *H10W 72/90* (2026.01); *H10W 72/931* (2026.01);
(Continued)

(58) Field of Classification Search
CPC ......... H01L 24/80; H01L 24/05; H01L 24/08; H01L 2224/05647; H01L 2224/08145;
(Continued)

(56) References Cited

U.S. PATENT DOCUMENTS

| | | | |
|---|---|---|---|
| 5,341,979 | A | 8/1994 | Gupta |
| 5,753,536 | A | 5/1998 | Sugiyama et al. |

(Continued)

FOREIGN PATENT DOCUMENTS

| | | | |
|---|---|---|---|
| CN | 114836615 A | | 8/2022 |
| EP | 2 736 169 B1 | | 9/2016 |

(Continued)

OTHER PUBLICATIONS

International Search Report and Written Opinion for PCT/US2023/073485, dated Jan. 2, 2024, 14 pages.

(Continued)

*Primary Examiner* — Niki H Nguyen
(74) *Attorney, Agent, or Firm* — Knobbe, Martens, Olson & Bear, LLP

(57) ABSTRACT

Bonded structures and methods of forming a bonded structure are disclosed. A bonded structure can include a first element and a second element. The first element includes a first non-conductive field region and a first conductive feature. The second element includes a second non-conductive field region and a second conductive feature. The second element is directly bonded to the first element along a bonding interface such that the first non-conductive field region is directly bonded to the second non-conductive field region without an intervening adhesive, and the first conductive feature is directly bonded to the second conductive feature without an intervening adhesive. A first portion of the first non-conductive field region at the bonding interface has a first surface roughness and a second portion of the first non-conductive field region at the bonding interface has a second surface roughness. The second surface roughness can be different from the first surface roughness. The first surface roughness can be greater than 6 Å rms.

21 Claims, 9 Drawing Sheets

(51) Int. Cl.

| | |
|---|---|
| ***H01L 29/40*** | (2006.01) |
| ***H10W 72/90*** | (2026.01) |
| ***H10W 99/00*** | (2026.01) |
| *H10W 80/00* | (2026.01) |
| *H10W 90/00* | (2026.01) |

(52) U.S. Cl.
CPC ........ *H10W 72/951* (2026.01); *H10W 72/952* (2026.01); *H10W 80/033* (2026.01); *H10W 80/037* (2026.01); *H10W 80/327* (2026.01); *H10W 90/792* (2026.01)

(58) Field of Classification Search
CPC . H01L 2224/80031; H01L 2224/80047; H01L 2224/80365; H01L 2224/80379; H01L 2224/80896; H01L 2924/04642; H01L 2924/0504; H01L 2924/0544; H01L 2924/059; H01L 21/187; H01L 25/0657; H01L 21/76251; H01L 21/2007; H01L 2224/83896; H01L 25/0655; H01L 21/304; H01L 2224/0401; H01L 24/06; H01L 2224/08146; H01L 2224/08147; H01L 2224/80894; H01L 2224/8002; H01L 2224/05008; H01L 2224/1308; H01L 2224/08221; H01L 24/09; H01L 2224/08148; H01L 2224/08501; H01L 2224/08; H01L 2224/16145; H01L 2224/80201
See application file for complete search history.

(56) References Cited

U.S. PATENT DOCUMENTS

| | | | |
|---|---|---|---|
| 5,771,555 | A | 6/1998 | Eda et al. |
| 6,080,640 | A | 6/2000 | Gardner et al. |
| 6,423,640 | B1 | 7/2002 | Lee et al. |
| 6,465,892 | B1 | 10/2002 | Suga |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,105,980 | B2 | 9/2006 | Abbott et al. |
| 7,193,423 | B1 | 3/2007 | Dalton et al. |
| 7,750,488 | B2 | 7/2010 | Patti et al. |
| 7,803,693 | B2 | 9/2010 | Trezza |
| 8,147,630 | B2 | 4/2012 | George |
| 8,183,127 | B2 | 5/2012 | Patti et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,513,810 | B2 | 8/2013 | Tago |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 8,901,736 | B2 | 12/2014 | Shen et al. |
| 9,093,350 | B2 | 7/2015 | Endo et al. |
| 9,142,517 | B2 | 9/2015 | Liu et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,385,024 | B2 | 7/2016 | Tong et al. |
| 9,391,143 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,564,414 | B2 | 2/2017 | Enquist et al. |
| 9,620,481 | B2 | 4/2017 | Edelstein et al. |
| 9,656,852 | B2 | 5/2017 | Cheng et al. |
| 9,716,033 | B2 | 7/2017 | Enquist et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,893,004 | B2 | 2/2018 | Yazdani |
| 9,899,442 | B2 | 2/2018 | Katkar |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 10,002,844 | B1 | 6/2018 | Wang et al. |
| 10,026,605 | B2 | 7/2018 | Doub et al. |
| 10,075,657 | B2 | 9/2018 | Fahim et al. |
| 10,204,893 | B2 | 2/2019 | Uzoh et al. |
| 10,269,756 | B2 | 4/2019 | Uzoh |
| 10,276,619 | B2 | 4/2019 | Kao et al. |
| 10,276,909 | B2 | 4/2019 | Huang et al. |
| 10,283,400 | B1 | 5/2019 | Kelly et al. |
| 10,418,277 | B2 | 9/2019 | Cheng et al. |
| 10,434,749 | B2 | 10/2019 | Tong |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,508,030 | B2 | 12/2019 | Katkar et al. |
| 10,522,499 | B2 | 12/2019 | Enquist et al. |
| 10,707,087 | B2 | 7/2020 | Uzoh et al. |
| 10,727,219 | B2 | 7/2020 | Uzoh et al. |
| 10,784,191 | B2 | 9/2020 | Huang et al. |
| 10,790,262 | B2 | 9/2020 | Uzoh et al. |
| 10,807,314 | B1 | 10/2020 | Klinstein et al. |
| 10,840,135 | B2 | 11/2020 | Uzoh |
| 10,840,205 | B2 | 11/2020 | Fountain, Jr. et al. |
| 10,854,578 | B2 | 12/2020 | Morein |
| 10,879,211 | B2 | 12/2020 | Conte et al. |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,923,408 | B2 | 2/2021 | Huang et al. |
| 10,923,413 | B2 | 2/2021 | DeLaCruz |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,985,204 | B2 | 4/2021 | Kanel |
| 10,991,804 | B2 | 4/2021 | DeLaCruz et al. |
| 10,998,292 | B2 | 5/2021 | Lee et al. |
| 11,004,757 | B2 | 5/2021 | Katkar et al. |
| 11,011,494 | B2 | 5/2021 | Gao et al. |
| 11,011,503 | B2 | 5/2021 | Wang et al. |
| 11,031,285 | B2 | 6/2021 | Katkar et al. |
| 11,037,919 | B2 | 6/2021 | Uzoh et al. |
| 11,056,348 | B2 | 7/2021 | Theil |
| 11,069,734 | B2 | 7/2021 | Katkar |
| 11,088,099 | B2 | 8/2021 | Katkar et al. |
| 11,090,758 | B1 | 8/2021 | Klinstein et al. |
| 11,127,738 | B2 | 9/2021 | DeLaCruz et al. |
| 11,158,573 | B2 | 10/2021 | Uzoh et al. |
| 11,158,606 | B2 | 10/2021 | Gao et al. |
| 11,169,326 | B2 | 11/2021 | Huang et al. |
| 11,171,117 | B2 | 11/2021 | Gao et al. |
| 11,176,450 | B2 | 11/2021 | Teig et al. |
| 11,195,748 | B2 | 12/2021 | Uzoh et al. |
| 11,205,625 | B2 | 12/2021 | DeLaCruz et al. |
| 11,244,920 | B2 | 2/2022 | Uzoh |

(56) References Cited

U.S. PATENT DOCUMENTS

| | | | | |
|---|---|---|---|---|
| 11,256,004 | B2 | 2/2022 | Haba et al. | |
| 11,264,357 | B1 | 3/2022 | DeLaCruz et al. | |
| 11,276,676 | B2 | 3/2022 | Enquist et al. | |
| 11,296,044 | B2 | 4/2022 | Gao et al. | |
| 11,329,034 | B2 | 5/2022 | Tao et al. | |
| 11,348,898 | B2 | 5/2022 | DeLaCruz et al. | |
| 11,355,443 | B2 | 6/2022 | Huang et al. | |
| 11,367,652 | B2 | 6/2022 | Uzoh et al. | |
| 11,380,597 | B2 | 7/2022 | Katkar et al. | |
| 11,426,946 | B2 | 8/2022 | Klinstein et al. | |
| 11,873,128 | B2 | 1/2024 | Klinstein et al. | |
| 2002/0003307 | A1 | 1/2002 | Suga | |
| 2003/0071106 | A1 | 4/2003 | Bendat et al. | |
| 2004/0084414 | A1 | 5/2004 | Sakai et al. | |
| 2005/0161795 | A1 | 7/2005 | Tong et al. | |
| 2006/0057945 | A1 | 3/2006 | Hsu et al. | |
| 2007/0065985 | A1 | 3/2007 | Matsumura | |
| 2007/0111386 | A1 | 5/2007 | Kim et al. | |
| 2007/0262468 | A1 | 11/2007 | Nasu et al. | |
| 2007/0287264 | A1 | 12/2007 | Rogers | |
| 2008/0006938 | A1 | 1/2008 | Patti et al. | |
| 2008/0064189 | A1 | 3/2008 | Daubenspeck et al. | |
| 2010/0096699 | A1 | 4/2010 | Miyata | |
| 2011/0067803 | A1* | 3/2011 | Tong | H10D 62/10 156/221 |
| 2011/0084403 | A1 | 4/2011 | Yang et al. | |
| 2011/0308738 | A1 | 12/2011 | Maki et al. | |
| 2012/0068355 | A1 | 3/2012 | Aoki et al. | |
| 2012/0119258 | A1 | 5/2012 | Liang | |
| 2012/0313237 | A1* | 12/2012 | Sadaka | H10P 95/00 438/692 |
| 2013/0009321 | A1 | 1/2013 | Kagawa et al. | |
| 2013/0107415 | A1 | 5/2013 | Banna | |
| 2013/0140713 | A1 | 6/2013 | Yu et al. | |
| 2013/0320071 | A1 | 12/2013 | Yu et al. | |
| 2014/0015088 | A1 | 1/2014 | Chapelon | |
| 2014/0145338 | A1 | 5/2014 | Fujii et al. | |
| 2014/0175655 | A1 | 6/2014 | Chen et al. | |
| 2014/0264948 | A1 | 9/2014 | Chou et al. | |
| 2014/0319656 | A1 | 10/2014 | Marchena et al. | |
| 2014/0349465 | A1 | 11/2014 | Yamamoto et al. | |
| 2015/0064498 | A1 | 3/2015 | Tong | |
| 2015/0294900 | A1 | 10/2015 | Goto et al. | |
| 2015/0364434 | A1 | 12/2015 | Chen et al. | |
| 2016/0013099 | A1 | 1/2016 | Tanida et al. | |
| 2016/0181228 | A1 | 6/2016 | Higuchi et al. | |
| 2016/0197055 | A1 | 7/2016 | Yu et al. | |
| 2016/0343682 | A1 | 11/2016 | Kawasaki | |
| 2017/0221856 | A1 | 8/2017 | Yamauchi | |
| 2018/0102286 | A1 | 4/2018 | Uzoh et al. | |
| 2018/0175012 | A1 | 6/2018 | Wu et al. | |
| 2018/0182639 | A1 | 6/2018 | Uzoh et al. | |
| 2018/0182666 | A1 | 6/2018 | Uzoh et al. | |
| 2018/0190580 | A1 | 7/2018 | Haba et al. | |
| 2018/0190583 | A1 | 7/2018 | DeLaCruz et al. | |
| 2018/0219038 | A1 | 8/2018 | Gambino et al. | |
| 2018/0226371 | A1 | 8/2018 | Enquist | |
| 2018/0323177 | A1 | 11/2018 | Yu et al. | |
| 2018/0323227 | A1 | 11/2018 | Zhang et al. | |
| 2018/0331066 | A1 | 11/2018 | Uzoh et al. | |
| 2019/0088527 | A1 | 3/2019 | Uzoh | |
| 2019/0096842 | A1* | 3/2019 | Fountain, Jr. | H10P 52/403 |
| 2019/0115277 | A1 | 4/2019 | Yu et al. | |
| 2019/0131277 | A1 | 5/2019 | Yang et al. | |
| 2019/0148336 | A1 | 5/2019 | Chen et al. | |
| 2019/0152773 | A1 | 5/2019 | Herbsommer et al. | |
| 2019/0198409 | A1 | 6/2019 | Katkar et al. | |
| 2019/0385935 | A1 | 12/2019 | Gao et al. | |
| 2019/0385966 | A1 | 12/2019 | Gao et al. | |
| 2020/0013637 | A1 | 1/2020 | Haba | |
| 2020/0013765 | A1 | 1/2020 | Fountain, Jr. et al. | |
| 2020/0035641 | A1 | 1/2020 | Fountain, Jr. et al. | |
| 2020/0043910 | A1 | 2/2020 | Uzoh et al. | |
| 2020/0075520 | A1 | 3/2020 | Gao et al. | |
| 2020/0075533 | A1 | 3/2020 | Gao et al. | |
| 2020/0075553 | A1 | 3/2020 | DeLaCruz et al. | |
| 2020/0118973 | A1 | 4/2020 | Wang et al. | |
| 2020/0227367 | A1 | 7/2020 | Haba et al. | |
| 2020/0279821 | A1 | 9/2020 | Haba et al. | |
| 2020/0294908 | A1 | 9/2020 | Haba et al. | |
| 2020/0328162 | A1 | 10/2020 | Haba et al. | |
| 2020/0328164 | A1 | 10/2020 | DeLaCruz et al. | |
| 2020/0335408 | A1 | 10/2020 | Gao et al. | |
| 2020/0371154 | A1 | 11/2020 | DeLaCruz et al. | |
| 2020/0395321 | A1 | 12/2020 | Katkar et al. | |
| 2020/0411483 | A1 | 12/2020 | Uzoh et al. | |
| 2021/0098412 | A1 | 4/2021 | Haba et al. | |
| 2021/0104405 | A1 | 4/2021 | Kim et al. | |
| 2021/0118864 | A1 | 4/2021 | DeLaCruz et al. | |
| 2021/0143125 | A1 | 5/2021 | DeLaCruz et al. | |
| 2021/0181510 | A1 | 6/2021 | Katkar et al. | |
| 2021/0193603 | A1 | 6/2021 | DeLaCruz et al. | |
| 2021/0193624 | A1 | 6/2021 | DeLaCruz et al. | |
| 2021/0193625 | A1 | 6/2021 | Katkar et al. | |
| 2021/0225651 | A1 | 7/2021 | Mitsuishi et al. | |
| 2021/0242152 | A1 | 8/2021 | Fountain, Jr. et al. | |
| 2021/0296282 | A1 | 9/2021 | Gao et al. | |
| 2021/0305202 | A1 | 9/2021 | Uzoh et al. | |
| 2021/0366820 | A1 | 11/2021 | Uzoh | |
| 2021/0407941 | A1 | 12/2021 | Haba | |
| 2022/0077063 | A1 | 3/2022 | Haba | |
| 2022/0077087 | A1 | 3/2022 | Haba | |
| 2022/0139867 | A1 | 5/2022 | Uzoh | |
| 2022/0139869 | A1 | 5/2022 | Gao et al. | |
| 2022/0208650 | A1 | 6/2022 | Gao et al. | |
| 2022/0208702 | A1 | 6/2022 | Uzoh | |
| 2022/0208723 | A1 | 6/2022 | Katkar et al. | |
| 2022/0230895 | A1 | 7/2022 | Gregory | |
| 2022/0246497 | A1 | 8/2022 | Fountain, Jr. et al. | |
| 2022/0246564 | A1 | 8/2022 | Gao et al. | |
| 2022/0285213 | A1 | 9/2022 | Uzoh et al. | |
| 2022/0285303 | A1 | 9/2022 | Mirkarimi et al. | |
| 2022/0319901 | A1 | 10/2022 | Suwito et al. | |
| 2022/0320035 | A1 | 10/2022 | Uzoh et al. | |
| 2022/0320036 | A1 | 10/2022 | Gao et al. | |
| 2023/0005850 | A1 | 1/2023 | Fountain, Jr. | |
| 2023/0019869 | A1 | 1/2023 | Mirkarimi et al. | |
| 2023/0036441 | A1 | 2/2023 | Haba et al. | |
| 2023/0067677 | A1 | 3/2023 | Lee et al. | |
| 2023/0069183 | A1 | 3/2023 | Haba | |
| 2023/0100032 | A1 | 3/2023 | Haba et al. | |
| 2023/0115122 | A1 | 4/2023 | Uzoh et al. | |
| 2023/0122531 | A1 | 4/2023 | Uzoh | |
| 2023/0123423 | A1 | 4/2023 | Gao et al. | |
| 2023/0125395 | A1 | 4/2023 | Gao et al. | |
| 2023/0130259 | A1 | 4/2023 | Haba et al. | |
| 2023/0132632 | A1 | 5/2023 | Katkar et al. | |
| 2023/0140107 | A1 | 5/2023 | Uzoh et al. | |
| 2023/0142680 | A1 | 5/2023 | Guevara et al. | |
| 2023/0154816 | A1 | 5/2023 | Haba et al. | |
| 2023/0154828 | A1 | 5/2023 | Haba et al. | |
| 2023/0187264 | A1 | 6/2023 | Uzoh et al. | |
| 2023/0187317 | A1 | 6/2023 | Uzoh | |
| 2023/0187398 | A1 | 6/2023 | Gao et al. | |
| 2023/0187412 | A1 | 6/2023 | Gao et al. | |
| 2023/0197453 | A1 | 6/2023 | Fountain, Jr. et al. | |
| 2023/0197496 | A1 | 6/2023 | Theil | |
| 2023/0197559 | A1 | 6/2023 | Haba et al. | |
| 2023/0197560 | A1 | 6/2023 | Katkar et al. | |
| 2023/0197655 | A1 | 6/2023 | Theil et al. | |
| 2023/0207402 | A1 | 6/2023 | Fountain, Jr. et al. | |
| 2023/0207437 | A1 | 6/2023 | Haba | |
| 2023/0207474 | A1 | 6/2023 | Uzoh et al. | |
| 2023/0207514 | A1 | 6/2023 | Gao et al. | |
| 2023/0215836 | A1 | 7/2023 | Haba et al. | |
| 2023/0245950 | A1 | 8/2023 | Haba et al. | |
| 2023/0268300 | A1 | 8/2023 | Uzoh et al. | |
| 2023/0343734 | A1 | 10/2023 | Uzoh et al. | |
| 2023/0360950 | A1 | 11/2023 | Gao | |
| 2023/0361074 | A1 | 11/2023 | Uzoh et al. | |
| 2023/0369136 | A1 | 11/2023 | Uzoh et al. | |

(56) References Cited

U.S. PATENT DOCUMENTS

| | | | |
|---|---|---|---|
| 2023/0375613 | A1 | 11/2023 | Haba et al. |
| 2024/0213210 | A1 | 6/2024 | Haba et al. |

FOREIGN PATENT DOCUMENTS

| | | | |
|---|---|---|---|
| JP | 2002-353416 | A | 12/2002 |
| JP | 2013-033786 | A | 2/2013 |
| JP | 2018-160519 | | 10/2018 |
| KR | 10-0386954 | B1 | 6/2003 |
| KR | 20060001420 | A | 1/2006 |
| KR | 10-1814554 | B1 | 1/2018 |
| KR | 2020-0034455 | A | 3/2020 |
| WO | WO 2005/043584 | A2 | 5/2005 |

OTHER PUBLICATIONS

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Fukushima, Takafumi et al., "Oxide-oxide thermocompression direct bonding technologies with capillary self-assembly for multichip-to-wafer heterogeneous 3D system integration," Micromachines, Oct. 2016, vol. 7, No. 184, p. 18 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Leissa, A.W., "Vibration of Plates," NASA SP-160, 1969, 362 pages.

Lim, K. et al., "Design and simulation of symmetric wafer-to-wafer bonding compensating a gravity effect," 2020 IEEE 70th Electronic Components and Technology Conference (ECTC), doi: 10.1109/ECTC32862.2020.00234 (2020), 6 pages.

Moriceau, H. et al., "Overview of recent direct wafer bonding advances and applications," Advances in Natural Sciences-Nanoscience and Nanotechnology, 2010, 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Nakanishi, H. et al., "Studies on SiO2-SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820."

Plobi, A. et al., "Wafer direct bonding: tailoring adhesion between brittle materials," Materials Science and Engineering Review Journal, 1999, R25, 88 pages.

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image.".

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Zgheib, Elia et al., "Multilayered models for determining the Young's modulus of thin films by means of Impulse Excitation Technique," https://www.sciencedirect.com/science/article/pii/S0167663619304752, Manuscript_68d36734cad5d1ad97e7c65bfb45f5d1, 2019, 39 pages.

Rossing et al., "Principles of Vibration and Sound", 2nd Edition; published by Springer-Verlag, New York, 2004; Book Review by P.L.Marston, 2 pages.

Xu et al., "A Novel Design of Temporary Bond Debond Adhesive Technology for Wafer-Level Assembly". 2020 IEEE 70th Electronic Components and Technology Conference (ECTC), pp. 68-74.

* cited by examiner

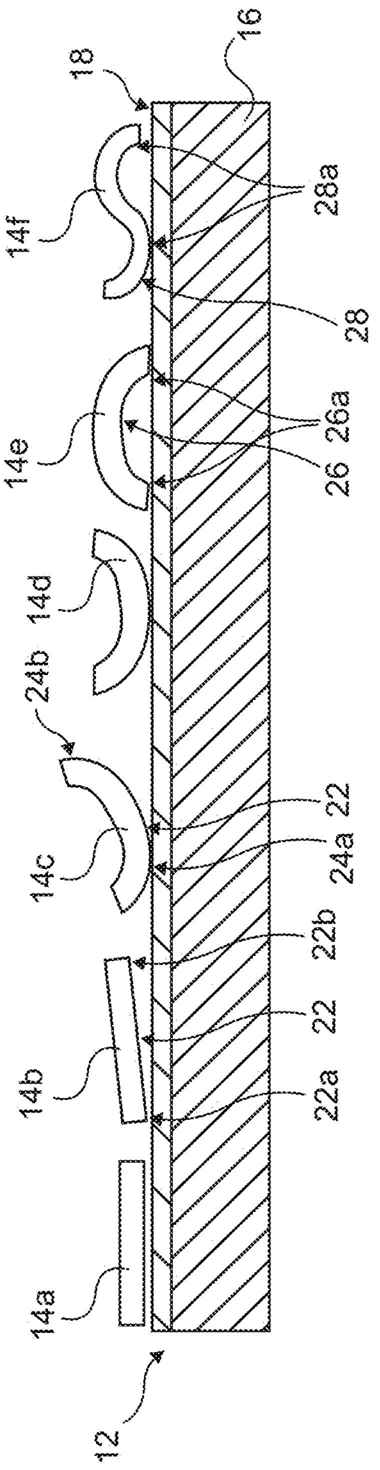
Fig. 3A
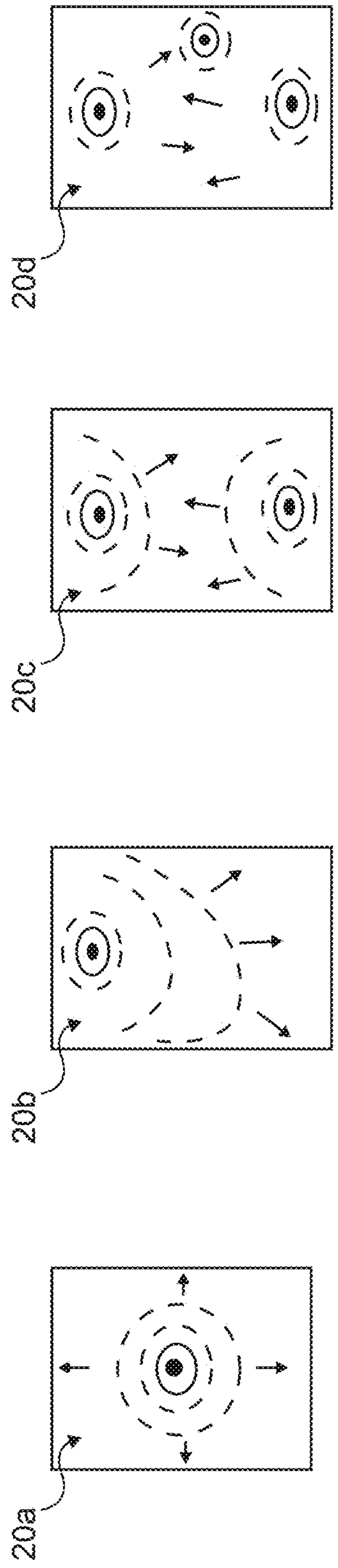
Fig. 3B
Fig. 3C
Fig. 3D
Fig. 3E

BONDED STRUCTURE AND METHOD OF FORMING SAME

CROSS-REFERENCE TO RELATED APPLICATIONS

This application claims priority to U.S. Provisional Patent Application No. 63/374,869, filed Sep. 7, 2022, the entire contents of which are incorporated by reference in their entirety and for all purposes.

BACKGROUND

Field

The field relates to bonded structures and methods of forming a bonded structure.

Description of the Related Art

Semiconductor elements, such as integrated device dies or chips, may be mounted or stacked on other elements thereby forming a bonded structure. For example, a semiconductor element can be mounted to a carrier, such as a package substrate, an interposer, a reconstituted wafer or element, etc. As another example, a semiconductor element can be stacked on top of another semiconductor element, e.g., a first integrated device die can be stacked on a second integrated device die. Each of the semiconductor elements can have conductive pads for mechanically and electrically bonding the semiconductor elements to one another. There is a continuing need for improved methods for forming the bonded structure.

BRIEF DESCRIPTION OF THE DRAWINGS

Specific implementations will now be described with reference to the following drawings, which are provided by way of example, and not limitation.

FIG. 3A is a schematic cross sectional side view of a host element and six different elements during a bonding process.

FIGS. 3B-3E are schematic diagrams showing bonding waves between an element and the bonding surface of the host element.

DETAILED DESCRIPTION OF THE PREFERRED EMBODIMENT

Figure 1A:
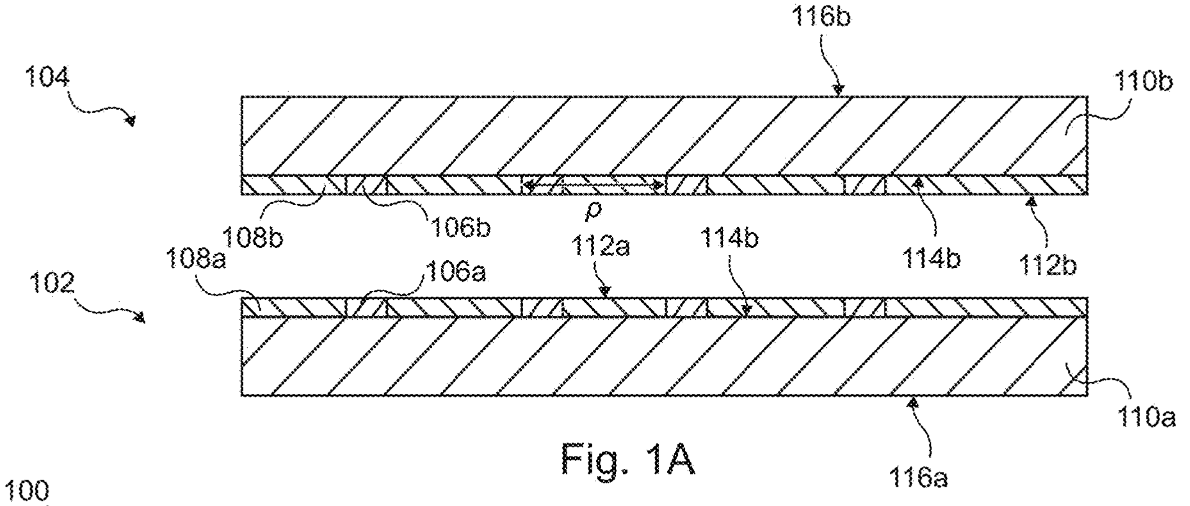
FIG. 1A is a schematic cross sectional side view of two elements prior to bonding.
Figure 1B:
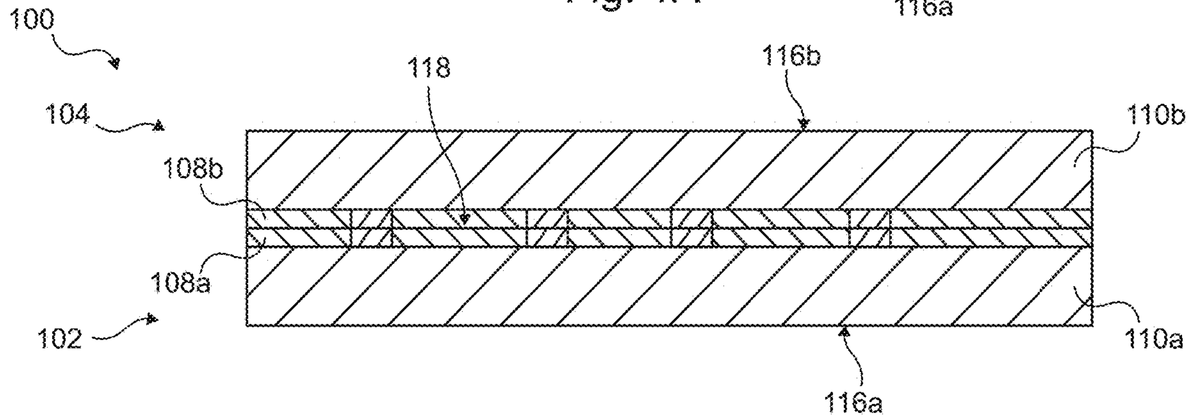
FIG. 1B is a schematic cross sectional side view of the two elements shown in FIG. 1A after bonding.

Various embodiments disclosed herein relate to directly bonded structures in which two or more elements can be directly bonded to one another without an intervening adhesive. FIGS. 1A and 1B schematically illustrate a process for forming a directly bonded structure without an intervening adhesive according to some embodiments. In FIGS. 1A and 1B, a bonded structure 100 comprises two elements 102 and 104 that can be directly bonded to one another without an intervening adhesive. Two or more semiconductor elements (such as integrated device dies, wafers, etc.) 102 and 104 may be stacked on or bonded to one another to form the bonded structure 100. Conductive features 106*a* (e.g., contact pads, exposed ends of vias (e.g., TSVs), or a through substrate electrodes) of a first element 102 may be electrically connected to corresponding conductive features 106*b* of a second element 104. Any suitable number of elements can be stacked in the bonded structure 100. For example, a third element (not shown) can be stacked on the second element 104, a fourth element (not shown) can be stacked on the third element, and so forth. Additionally or alternatively, one or more additional elements (not shown) can be stacked laterally adjacent one another along the first element 102. In some embodiments, the laterally stacked additional element may be smaller than the second element. In some embodiments, the laterally stacked additional element may be two times smaller than the second element.

In some embodiments, the elements 102 and 104 are directly bonded to one another without an adhesive. In various embodiments, a non-conductive field region that includes a non-conductive or dielectric material can serve as a first bonding layer 108*a* of the first element 102 which can be directly bonded to a corresponding non-conductive field region that includes a non-conductive or dielectric material serving as a second bonding layer 108*b* of the second element 104 without an adhesive. The non-conductive bonding layers 108*a* and 108*b* can be disposed on respective front sides 114*a* and 114*b* of device portions 110*a* and 110*b*, such as a semiconductor (e.g., silicon) portion of the elements 102, 103. Active devices and/or circuitry can be patterned and/or otherwise disposed in or on the device portions 110*a* and 110*b*. Active devices and/or circuitry can be disposed at or near the front sides 114*a* and 114*b* of the device portions 110*a* and 110*b*, and/or at or near opposite backsides 116*a* and 116*b* of the device portions 110*a* and 110*b*. The non-conductive material can be referred to as a non-conductive bonding region or bonding layer 108*a* of the first element 102. In some embodiments, the non-conductive bonding layer 108*a* of the first element 102 can be directly bonded to the corresponding non-conductive bonding layer 108*b* of the second element 104 using dielectric-to-dielectric bonding techniques. For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers 108*a* and/or 108*b* can comprise a non-conductive material such as a dielectric material, such as silicon oxide, or an undoped semiconductor material, such as undoped silicon. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SICOH dielectrics, silicon carbonitride or diamond-like carbon or a material comprising of a diamond surface. Such carbon-containing ceramic materials can be considered inorganic, despite the inclusion of carbon. In some embodiments, the dielectric materials do not comprise polymer materials, such as epoxy, resin or molding materials.

In various embodiments, direct hybrid bonds can be formed without an intervening adhesive. For example, non-conductive bonding surfaces 112*a* and 112*b* can be polished to a high degree of smoothness. The bonding surfaces 112*a* and 112*b* can be cleaned and exposed to a plasma and/or etchants to activate the surfaces 112*a* and 112*b*. In some embodiments, the surfaces 112*a* and 112*b* can be terminated with a species after activation or during activation (e.g., during the plasma and/or etch processes). Without being limited by theory, in some embodiments, the activation process can be performed to break chemical bonds at the bonding surfaces 112*a* and 112*b*, and the termination process can provide additional chemical species at the bonding surfaces 112*a* and 112*b* that improves the bonding energy during direct bonding. In some embodiments, the activation and termination are provided in the same step, e.g., a plasma to activate and terminate the surfaces 112*a* and 112*b*. In other embodiments, the bonding surfaces 112*a* and 112*b* can be terminated in a separate treatment to provide the additional species for direct bonding. In various embodiments, the terminating species can comprise nitrogen. For example, in some embodiments, the bonding surface(s) 112*a*, 112*b* can be exposed to a nitrogen-containing plasma. Further, in some embodiments, the bonding surfaces 112*a* and 112*b* can be exposed to fluorine. For example, there may be one or multiple fluorine peaks at or near a bonding interface 118 between the first and second elements 102, 104. Thus, in the directly bonded structure 100, the bonding interface 118 between two non-conductive materials (e.g., the bonding layers 108*a* and 108*b*) can comprise a very smooth interface with higher nitrogen content and/or fluorine peaks at the bonding interface 118. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive features 106*a* of the first element 102 can also be directly bonded to corresponding conductive features 106*b* of the second element 104. For example, a hybrid bonding technique can be used to provide conductor-to-conductor direct bonds along the bond interface 118 that includes covalently direct bonded non-conductive-to-non-conductive (e.g., dielectric-to-dielectric) surfaces, prepared as described above. In various embodiments, the conductor-to-conductor (e.g., conductive feature 106*a* to conductive feature 106*b*) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, non-conductive (e.g., dielectric) bonding surfaces 112*a*, 112*b* (for example, inorganic dielectric surfaces) can be prepared and directly bonded to one another without an intervening adhesive as explained above. Conductive contact features (e.g., conductive features 106*a* and 106*b* which may be at least partially surrounded by non-conductive dielectric field regions within the bonding layers 108*a*, 108*b*) may also directly bond to one another without an intervening adhesive. In various embodiments, the conductive features 106*a*, 106*b* can comprise discrete pads or traces at least partially embedded in the non-conductive field regions. In some embodiments, the conductive contact features can comprise exposed contact surfaces of through substrate vias (TSVs). In some embodiments, the respective conductive features 106*a* and 106*b* can be recessed below exterior (e.g., upper) surfaces (non-conductive bonding surfaces 112*a* and 112*b*) of the dielectric field region or non-conductive bonding layers 108*a* and 108*b*, for example, recessed by less than 30 nm, less than 20 nm, less than 15 nm, or less than 10 nm, for example, recessed in a range of 2 nm to 20 nm, or in a range of 4 nm to 10 nm. In various embodiments, prior to direct bonding, the recesses in the opposing elements can be sized such that the total gap between opposing contact pads is less than 15 nm, or less than 10 nm. The non-conductive bonding layers 108*a* and 108*b* can be directly bonded to one another without an adhesive at room temperature in some embodiments and, subsequently, the bonded structure 100 can be annealed. Upon annealing, the conductive features 106*a* and 106*b* can expand and contact one another to form a metal-to-metal direct bond. Beneficially, the use of Direct Bond Interconnect, or DBI®, techniques commercially available from Xperi of San Jose, CA, can enable high density of conductive features 106*a* and 106*b* to be connected across the direct bond interface 118 (e.g., small or fine pitches for regular arrays). In some embodiments, the pitch of the conductive features 106*a* and 106*b*, such as conductive traces embedded in the bonding surface of one of the bonded elements, may be less than 100 microns or less than 10 microns or even less than 2 microns. For some applications, the ratio of the pitch of the conductive features 106*a* and 106*b* to one of the dimensions (e.g., a diameter) of the bonding pad is less than is less than 20, or less than 10, or less than 5, or less than 3 and sometimes desirably less than 2. In other applications, the width of the conductive traces embedded in the bonding surface of one of the bonded elements may range between 0.3 to 20 microns, e.g., in a range of 0.3 to 3 microns. In various embodiments, the conductive features 106*a* and 106*b* and/or traces can comprise copper, although other metals may be suitable.

Thus, in direct bonding processes, a first element 102 can be directly bonded to a second element 104 without an intervening adhesive. In some arrangements, the first element 102 can comprise a singulated element, such as a singulated integrated device die. In other arrangements, as shown in FIGS. 1A and 1B, the first element 102 can comprise a carrier or substrate (e.g., a wafer) that includes a plurality (e.g., tens, hundreds, or more) of device regions that, when singulated, form a plurality of integrated device dies. Similarly, the second element 104 can comprise a singulated element, such as a singulated integrated device die, as shown in FIGS. 1A and 1B. In other arrangements, the second element 104 can comprise a carrier or substrate (e.g., a wafer). The embodiments disclosed herein can accordingly apply to wafer-to-wafer, die-to-die, or die-to-wafer bonding processes. In wafer-to-wafer (W2W) processes, two or more wafers can be directly bonded to one another (e.g., direct hybrid bonded) and singulated using a suitable singulation process. After singulation, side edges of the singulated structure (e.g., the side edges of the two bonded elements) may be substantially flush and may include markings indicative of the singulation process (e.g., saw markings if a saw singulation process is used).

As explained herein, the first and second elements 102 and 104 can be directly bonded to one another without an adhesive, which is different from a deposition process. In one application, a width of the first element 102 in the bonded structure is similar to a width of the second element 104. In some other embodiments, a width of the first element 102 in the bonded structure 100 is different from a width of the second element 104. Similarly, the width or area of the larger element in the bonded structure may be at least 10% larger than the width or area of the smaller element. The first and second elements 102 and 104 can accordingly comprise non-deposited elements. Further, directly bonded structures 100, unlike deposited layers, can include a defect region along the bond interface 118 in which nanometer-scale voids (nanovoids) are present. The nanovoids may be formed due to activation of the bonding surfaces 112*a* and 112*b* (e.g., exposure to a plasma). As explained above, the bond interface 118 can include concentration of materials from the activation and/or last chemical treatment processes. For example, in embodiments that utilize a nitrogen plasma for activation, a nitrogen peak can be formed at the bond interface 118. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolized (OH-terminated) surface with NH2 molecules, yielding a nitrogen-terminated surface. In embodiments that utilize an oxygen plasma for activation, an oxygen peak can be formed at the bond interface 118. In some embodiments, the bond interface 118 can comprise silicon oxynitride, silicon oxycarbonitride, or silicon carbonitride. As explained herein, the direct bond can comprise a covalent bond, which is stronger than van Der Waals bonds. The bonding layers 108*a* and 108*b* can also comprise polished surfaces that are planarized to a high degree of smoothness.

In various embodiments, the metal-to-metal bonds between the contact pads 106*a* and 106*b* can be joined such that copper grains grow into each other across the bond interface 118. In some embodiments, the copper can have grains oriented along the 111 crystal plane for improved copper diffusion across the bond interface 118. The bond interface 118 can extend substantially entirely to at least a portion of the bonded conductive features 106*a* and 106*b*, such that there is substantially no gap between the non-conductive bonding layers 108*a* and 108*b* at or near the bonded conductive features 106*a* and 106*b*. In some embodiments, a barrier layer may be provided under the conductive features 106*a* and 106*b* (e.g., which may include copper). In other embodiments, however, there may be no barrier layer under the conductive features 106*a* and 106*b*, for example, as described in U.S. Pat. No. 11,195,748, which is incorporated by reference herein in its entirety and for all purposes.

Beneficially, the use of the hybrid bonding techniques described herein can enable extremely fine pitch between adjacent contact pads 106*a* and 106*b*, and/or small pad sizes. For example, in various embodiments, the pitch p (i.e., the distance from edge-to-edge or center-to-center, as shown in FIG. 1A) between adjacent conductive features 106*a* (or 106*b*) can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

Figure 2B:
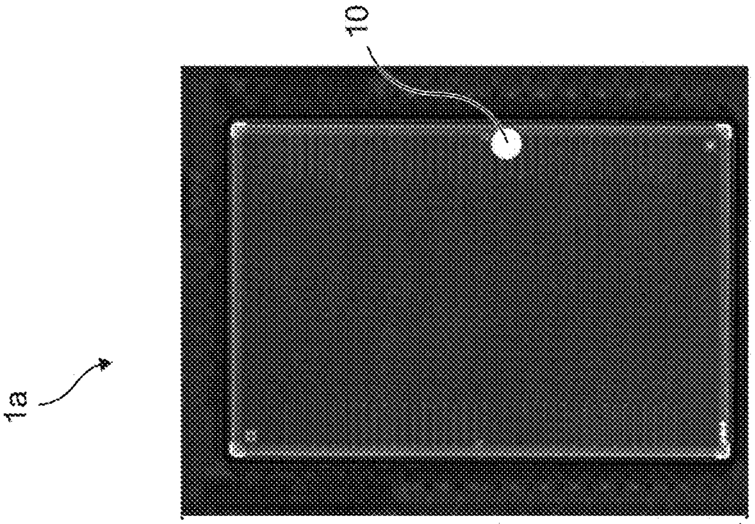
FIG. 2B is an enlarged view of a bonded structure of the image of FIG. 1A having an occluded void.
Figure 2A:
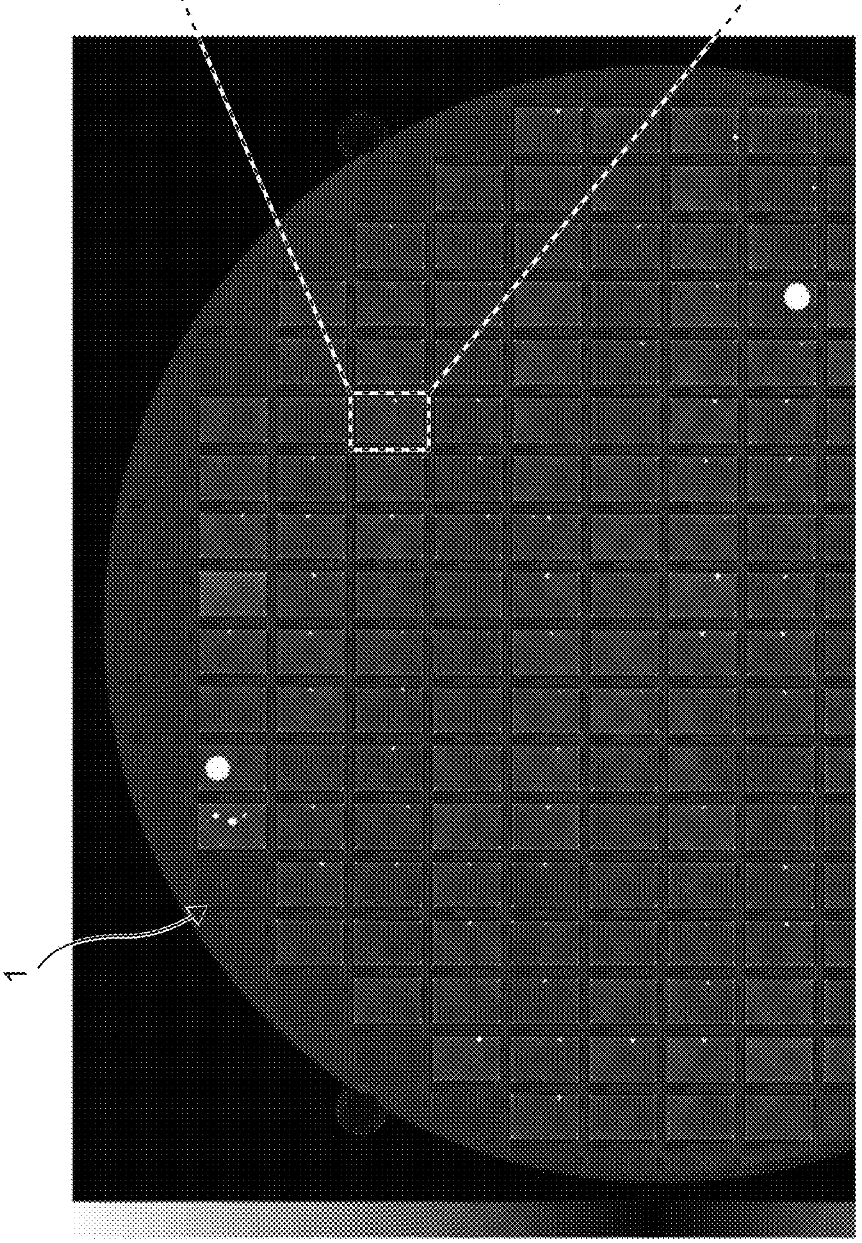
FIG. 2A is a scanning acoustic microscopy (CSAM) image of bonded structures.

FIG. 2A is a scanning acoustic microscopy (CSAM) image of bonded structures 1. FIG. 2B is an enlarged view of a bonded structure 1*a* of the image of FIG. 1A having an occluded void 10. The occluded void 10 may inhibit the joining of particular contact pads in the vicinity, creating openings or other failures in the bond. For example, any void larger than the pad diameter and/or pitch can potentially create an opening and hybrid bond failure. There are various reasons that a void may be present in a bonded structure. For example, an unevenly or non-uniformly propagated bonding wave during the contact of a surface of an element to a surface of another element may cause the void in a bonded structure.

FIG. 3A is a schematic cross sectional side view of a host element 12 and six different elements 14*a*, 14*b*, 14*c*, 14*d*, 14*e*, 14*f* having different warpage profile before a bonding process. The host element 12 can include a substrate 16 and a bonding surface 18. The substrate 16 can comprise a device portion, such as a semiconductor (e.g., silicon) portion. For example, the host element 12 can comprise the first element 102, and the elements 14*a*, 14*b*, 14*c*, 14*d*, 14*e*, 14*f* can comprise second elements 104 that are to be directly bonded to the first element 102. The elements 14*a*-14*f* are configured to directly bond to the bonding surface 18 of the host element 12. In general, it is preferable that the second element 104 is flat, with relatively low warpage. In practice, the second elements 104 (e.g., the elements 14*a* to 140 can exhibit large variations in warpage and/or a warpage profile as illustrated in FIG. 3A. Depending, for example, on the fabrication processes, the variation of the warpage of the second elements 104 may range between ±5 μm to ±300 μm. The profile of the surface of the warped second element 104 with respect to the planar bonding surface 18 of the host element 12 may be concave, convex, saddle or the combinations thereof. In some embodiments, the elements 14*a*-14*f* can comprise integrated device dies.

The element 14*a* is being provided on the bonding surface 18 of the host element 12. The element 14*a* can have a flat shape with a warpage of less than ±40 μm. For example, the element 14*a* can comprise a die with a thickness in a range of 40 μm to 100 μm, and have a flat shape with a warpage of less than ±20 μm. The die can have a width of about 8 mm and a length of about 10 mm, for example. For example, element 14*a* can be provided on the bonding surface 18 with a surface of the element 14*a* being generally parallel with the bonding surface 18. In some embodiments, during a bonding operation, the bonding head of the bonding tool (not shown) picks the element 14*a* from the backside opposite the bonding surface of the element 14*a*. The element 14*a* may be adapted on the bonding head such that the center of the element 14*a* first makes contact with the bonding surface 18 of the host element 12. The initial contact of the center of element 14*a* on the bonding surface 18 promotes a more even or uniform outward radial propagation of the bonding wave or waves from the center region of the element 14*a* outwardly towards the peripheries of the element 14*a*. The propagation of contact across the bonding surface can be referred to as the bonding wave.

The element 14*d* has a convexly warped shape. For example, the element 14*d* is convexly warped relative to the generally flat, straight element 14*a*. The element 14*d* is being provided on the bonding surface 18 of the host element 12. The element 14*d* can be provided on the bonding surface 18 such that the element 14*d* makes contact with the bonding surface 18 of the host element 12 from the center of the element 14*d* to peripheries or edges of the element 14*d*. The bonding wave between the element 14*d* and the host element 12 can propagate from the initial center contact region between element 14*d* and host element 12 to the peripheries or edge of element 14*d*.

FIG. 3B is a schematic diagram showing the bonding wave 20*a* between an element (e.g., the elements 14*a*, 14*d*) and the bonding surface 18 of the host element 12. The bonding wave 20*a* indicates that the element 14*a* makes contact and bonds with the bonding surface 18 of the host element 12 from the center of the element 14*a* to edges of the element 14*a*.

The element 14*b* has the same or generally similar flat shape as the element 14*a*. The element 14*b* is being provided on the bonding surface 18 of the host element 12. The element 14*b* can be provided on the bonding surface 18 such that the element 14*b* makes contact with the bonding surface 18 of the host element 12 from a first edge portion 22*a* at or near a first edge of a surface 22 of the element 14*b* to a second edge portion 22*b* at or near a second edge of the surface 22 of the element 14*b* opposite the first edge portion 22*a*. For example, the surface 22 of the element 14*b* can be angled relative to the bonding surface 18 of the host element 12 at initial contact. In some embodiments, the angle between the surface 22 and the bonding surface 18 at initial contact can be in a range between 1° and 15°, 3° and 15°, 5° and 15°, 10° and 15°, 3° and 10°, or 5° and 10°. The bonding wave can propagate progressively outwards from the first edge portion 22*a* to the second edge portion 22*b* of the surface 22 of the element 14*b* opposite the first edge portion 22*a*. The angle between the surface 22 and the bonding surface 18 can be smaller as the bonding wave propagates. In some embodiments, the first edge portion 22*a* can include a portion that is within 5%, 10% or 20% of a length of the element 14*b* (defined by a distance between the first and second edges) from the first edge.

The element 14*c* has a convexly warped shape. For example, the element 14*c* is convexly warped relative to the generally flat, straight element 14*a*. The element 14*c* is being provided on the bonding surface 18 of the host element 12. The element 14*c* can be provided on the bonding surface 18 such that the element 14*c* makes contact with the bonding surface 18 of the host element 12 from a first portion 24*a* of a surface 24 of the element 14*c* to a second portion 24*b* of the surface 24 of the element 14*c* opposite the first portion 24*a*. The bonding wave can propagate progressively outwards from the first portion 24*a* to the second portion 24*b* of the surface 24 of the element 14*c* opposite the first portion 24*a*. The first portion 24*a* can comprise a portion of the element near an edge of the surface 24. For example, the first portion 24*a* can comprise a portion between the edge of the surface 24 and a center of the surface 24. In some embodiments, the bonding wave can propagate in opposite directions away from each other, when the first portion 24*a* of element 14*c* is located between an edge and the center of element 14*a*.

FIG. 3C is a schematic diagram showing a bonding wave 20*b* between an element (e.g., the elements 14*b*, 14*c*) and the bonding surface 18 of the host element 12. The bonding wave 20*b* indicates that the element 14*b*, 14*c* makes contact and bond with the bonding surface 18 of the host element 12 from one side portion to the other.

The element 14*e* has a concavely warped shape. For example, the element 14 is concavely warped relative to the generally flat, straight element 14*a*. The element 14*e* is being provided on the bonding surface 18 of the host element 12. The element 14*e* can be provided on the bonding surface 18 such that the element 14*e* makes contact with the bonding surface 18 of the host element 12 from edge portions 26*a* of a surface 26 of the element 14*e* to other portions (e.g., interior portions) of the surface 26 of the element 14*e*.

The element 14*f* comprises a saddle surface. For example, the element 14 is saddled relative to the generally flat, straight element 14*a*. The element 14*f* is being provided on the bonding surface 18 of the host element 12. The element 14*f* can be provided on the bonding surface 18 such that the element 14*f* can make contact with the bonding surface 18 of the host element 12 from portions 28*a* of a surface 28 of the element 14*e* to other portions of the surface 28 of the element 14*f*.

FIG. 3D is a schematic diagram showing a bonding wave 20*c* between an element (e.g., the elements 14*e*, 140 and the bonding surface 18 of the host element 12. The bonding wave 20*c* indicates that the element 14*e*, 14*f* makes contact and bonds with the bonding surface 18 of the host element 12 from multiple (e.g., two) contact points to other locations. In some embodiments, with multiple initial contact portions (e.g., the edge portions 26*a* of the element 14*e* and the portions 28*a* of the element 140, the bonding waves can propagate towards each other. The interaction of the multiple bonding waves may occlude or wrap around a portion of the element (e.g., the elements 14*e*, 140 and/or the host element 12 thereby trapping a patch of air, resulting in a void in the bonding interface between the element (e.g., the elements 14*e*, 140 and the host element 12.

FIG. 3E is a schematic diagram showing a bonding wave 20*d* between an element (e.g., the elements 14*e*, 140 and the bonding surface 18 of the host element 12. The bonding wave 20*d* indicates that the element 14*e*, 14*f* makes contact with the bonding surface 18 of the host element 12 from multiple (e.g., three) contact portions or points to other locations. With multiple initial first contact portions, competing multiple bonding waves are generated between the element (e.g., the elements 14*e*, 140 and the host element 12. Portions of the competing multiple waves can propagate towards each other. The interaction of the competing multiple bonding waves may occlude or wrap around a portion of the element (e.g., the elements 14*e*, 140 and/or the host element 12 thereby trapping a patch of air, resulting in a void in the bonded first and second elements.

An element with a curved or warped shape may have more uneven or non-uniform bonding wave propagation that can increase the chance of forming a void between the bonded elements as compared with an element having a completely or generally straight surface or relatively low warpage. Such uneven or non-uniform bonding wave propagation can increase the chance of forming a void between bonded elements that can be problematic (e.g., a void with a void size larger than a pad diameter and/or pitch of conductive features). For example, a relatively large bonding void disposed between pads or conductive features in bonded element 102 and 104, disrupts electrical signal between the opposing conductive features; thus forming an open circuit. Such undesired open circuits lead to lower electric device yield in the bonded elements 102 and 104. The poor yielding devices may lead to a revenue loss. A thinner element may tend to have more curvature(s) and warpage than a thicker element, which in turn can increase the likelihood of voids being formed due to non-uniform bonding wave propagation.

Various embodiments disclosed herein relate to controlling the propagation of a bonding wave thereby reducing the likelihood of or preventing formation of a void between bonded elements of a bonded structure. Various embodiments disclosed herein can improve manufacturing yield and device reliability. The propagation of a bonding wave can be controlled by modifying a bonding speed at which the elements are directly bonded.

Figure 4A:
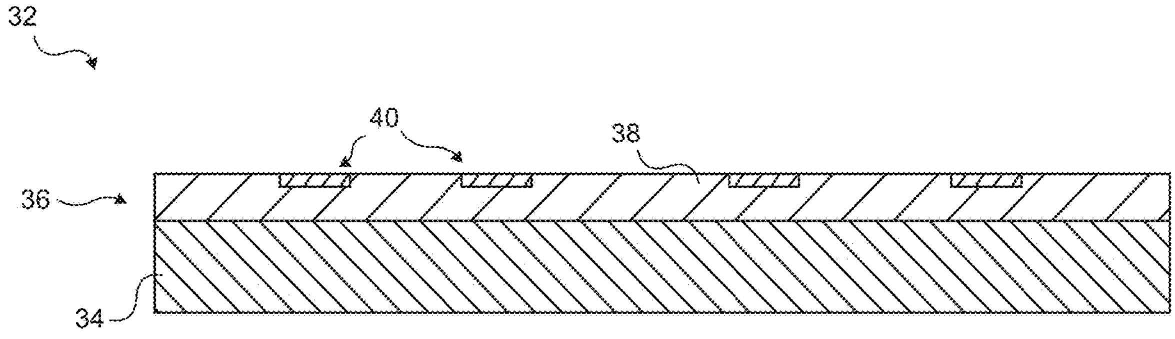
FIGS. 4A-4D illustrate steps in a method of forming a roughened surface according to an embodiment.

FIGS. 4A-4F illustrate various steps of forming bonded structures 2, 3. FIG. 4A is a schematic cross sectional side view of a first element 32. The first element 32 can include a device portion 34, such as a semiconductor (e.g., silicon) portion having circuitry patterned therein, and a bonding layer 36 over the device portion 34. The bonding layer 36 can include a non-conductive field region 38 and conductive features 40 spaced apart by portions of the non-conductive field region 38 and at least partially embedded in the non-conductive field region 38. The bonding layer 36 may comprise multiple metallization layers as found in back end of line (BEOL) or packaging redistribution layers. A bonding surface 42 of the first element 32 can be prepared for direct bonding as explained above. For example, the bonding surface 42 of the first element 32 can be polished to a high degree of smoothness in preparation for direct bonding. In some embodiments, the roughness of the polished non-conductive field region 38 can be less than 15 Å rms, less than 10 Å rms, or less than 5 Å rms. The non-conductive field region 38 can also include signatures of activation and/or termination for direct bonding, such as fluorine and nitrogen profiles, as described above.

Figure 4B:
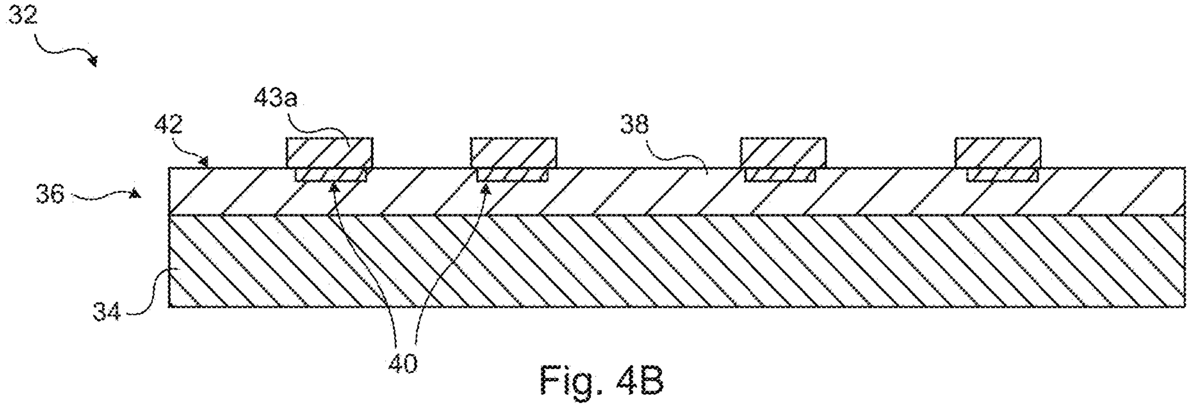

In FIG. 4B, a patterned masking structure (e.g., a resist layer 43*a*) can be provided over the bonding surface 42 of the first element 32. In some embodiments, the resist layer 43*a* can comprise a photoresist layer. The resist layer 43*a* can be patterned such that at least the conductive features 40 are covered by the photoresist layer 43*a*. In some embodiments, the resist layer 43*a* can at least partially cover a portion of the non-conductive field region 38 proximate the conductive feature 40. For example, portions of the non-conductive field region 38 around the conductive features 40 can be covered with resist layer 43*a*.

In some embodiments, the masking structure comprise a passivation layer. For example, the resist layer 43*a* can comprise benzotriazole (BTA), deposited from a 10 ppm to 100 ppm BTA solution. The BTA solution can be sprayed on the bonding surface 42 of the first element 32 before, for example, spin drying the first element 32. When the BTA solution is used as the resist layer 43*a*, resist layer 43*a* can be selectively formed over the conductive features 40. In some embodiments, the masking structure can comprise a multilayer structure, such as a combination of a resist layer and a passivation layer. The resist layer 43*a* disclosed herein is an example of a masking structure, and the resist layer 43*a* in various embodiments can be replaced with the passivation layer.

Figure 4C:
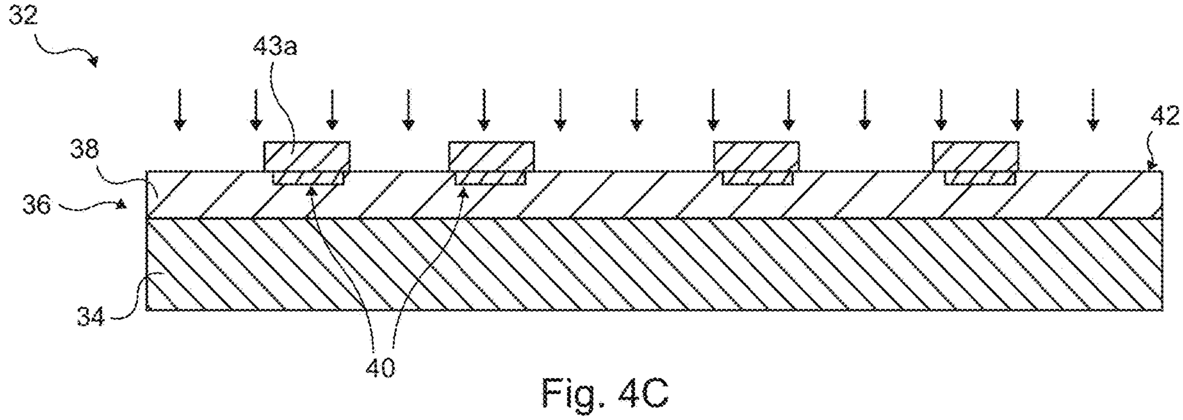

In FIG. 4C, portions of the polished non-conductive field region 38 can be selectively roughened. In some embodiments, the non-conductive field region 38 can be roughened by way of an etching process, such as a wet etch or reactive ion etching (RIE). The arrows in FIG. 4C can represent flow of the etchant.

Figure 4D:
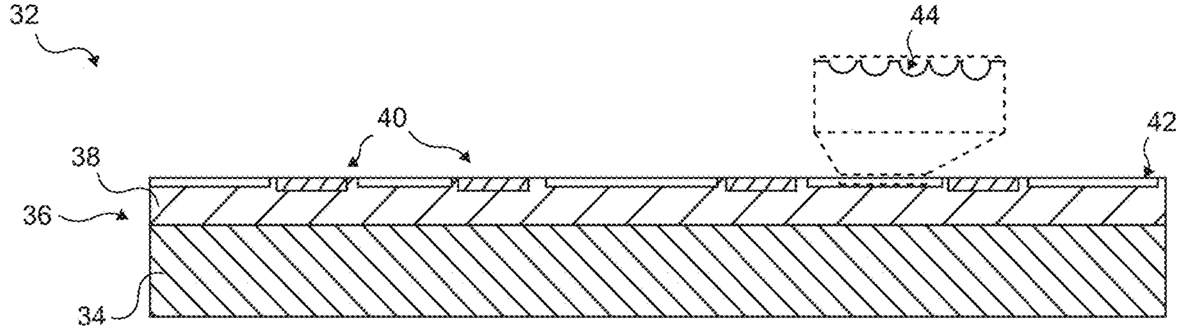

FIG. 4D shows the first element 32 having a non-conductive field region 38 selectively provided with a roughened surface 44. The resist layer 43*a* has been removed from the bonding surface 42 of the first element 32 in FIG. 4D. In some embodiments, the resist layer 43*a* can be removed with a removing agent, such as a photoresist removing solvent or a recommended developer by the supplier of the resist. For example, the resist layer 43*a* can be removed by a combination of plasma resist strip and a developer wet cleaning process. When the passivation layer is used as the masking structure as described above, for example, an alkaline chemical may be used to remove the passivation layer. After roughening the non-conductive bonding surface 38, the bonding surface of first element 32 can be cleaned to remove contaminants. The resist forming and removal process should not significantly degrade the smoothness or excessively etch the conductive features as to impair the conductive features. For example, the resist forming and resist removal steps should not increase the recess on the conductive features beyond the recommended specification for conductive features recess. In some embodiments, the resist layer 43*a* can be removed at a later stage before bonding another element to the first element 32 (see FIGS. 6A-7C). In some embodiments, the first element 32 may comprise a wafer for a wafer to wafer (W2W) bonding operation. In other embodiments, cleaned first element 32 may be mounted on a dicing frame for singulation operations. The singulation process may include coating the first element 32 with a protective layer before the sinulation process.

The roughened surface 44 can have a surface roughness that is rougher than the surface roughness of the non-conductive field region 38 after the polishing step but before the roughening process. The roughness can be controlled by adjusting the intensity, chemistry, and/or duration of the roughening process. In some embodiments, the roughened surface 44 may be roughened relative to the polished surface (e.g., the roughened surface 44 may have a roughness that is rougher than the polished surface) but can have a surface roughness that is sufficiently smooth for a direct bonding. For example, the roughened surface 44 can have a surface roughness of at least 10 Å rms, at least 15 Å rms, or at least 20 Å rms, for example a surface roughness in a range of 6 Å rms to 100 Å rms, 6 Å rms to 60 Å rms, 10 Å rms to 40 Å rms, 10 Å rms to 100 Å rms, 10 Å rms to 60 Å rms, 15 Å rms to 30 Å rms, 25 Å rms to 100 Å rms, 35 Å rms to 200 Å rms, 35 Å rms to 100 Å rms, 55 Å rms to 200 Å rms, 55 Å rms to 100 Å rms, 75 Å rms to 200 Å rms, 75 Å rms to 100 Å rms, or 100 Å rms to 200 Å rms.

Figure 4E:
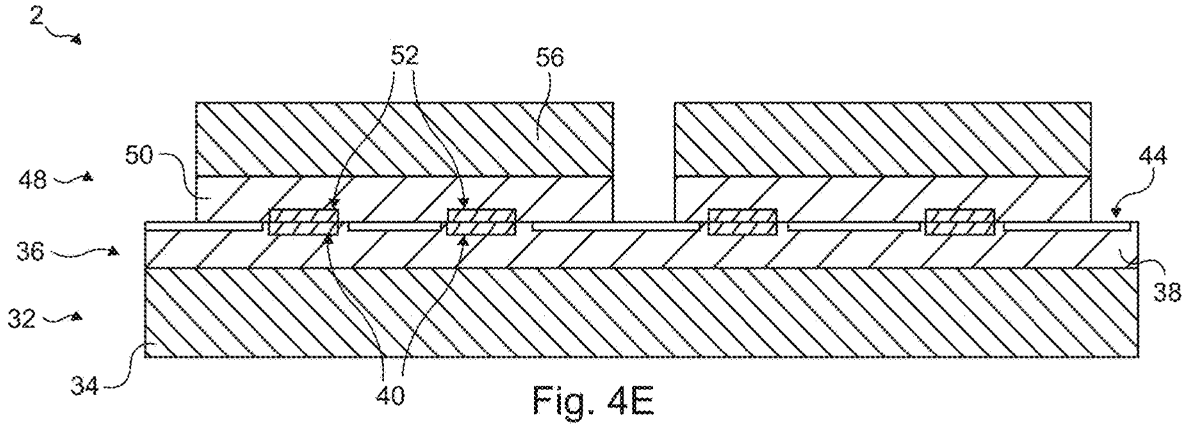
FIG. 4E is a schematic cross sectional side view of a bonded structure according to an embodiment.

FIG. 4E is a schematic cross sectional side view of the bonded structure 2 according to an embodiment. The bonded structure 2 can include the first element 32 and one or more elements including a second element 48 stacked over the first element 32. In some embodiments, the first element 32 can comprise a wafer and the second element 48 can comprise an integrated device die. In some other embodiments, the first element 32 can comprise an integrated device die and the second element 48 can comprise another integrated device die. The second element 48 can include a non-conductive field region 50, conductive features 52 spaced apart by at least a portion of the non-conductive field region 50, and a device portion 56. Portions of the non-conductive field region 50 of the second element 48 can be bonded to corresponding portions of the nonconductive field region 38 of the first element 32. The conductive features 52 of the second element 48 can be bonded to corresponding conductive features 40 of the first element 32. For example, the portions of the non-conductive field region 50 can be directly bonded to corresponding portions of the nonconductive field region 38 without an intervening adhesive, and the conductive features 52 can be directly bonded to corresponding conductive features 40 without an intervening adhesive.

The roughened surface 44 can contribute to changing a bonding contact area, bond energy, and a speed of the bonding. For example, the roughened surface 44 enables the first and second elements 32, 48 to have reduced bonding contact area, reduced bond energy, and reduced bonding wave propagation times or speed as compared to elements that include only smooth surface. Such reduction in bonding contact area, bond energy, and bond speed can contribute to reducing the chance of void formation due to curvature and/or warpage of an element.

The roughened surface 44 enables the portions of the non-conductive field region 50 and the corresponding portions of the nonconductive field region 38 to be directly bonded with a sufficient strength to enable direct hybrid bonding between the first and second elements 32, 48. In some embodiments, a bond strength between the non-conductive field region 50 and the nonconductive field region 38 can be in a range of, for example, 500 mJ/cm$^2$ to 2500 mJ/cm$^2$, 750 mJ/cm$^2$ to 2000 mJ/cm$^2$, 1000 mJ/cm$^2$ to 1500 mJ/cm$^2$, 500 mJ/cm$^2$ to 1250 mJ/cm$^2$, 500 mJ/cm$^2$ to 1000 mJ/cm$^2$, 500 mJ/cm$^2$ to 750 mJ/cm$^2$, 750 mJ/cm$^2$ to 1250 mJ/cm$^2$, or 750 mJ/cm$^2$ to 1000 mJ/cm$^2$.

Figure 4F:
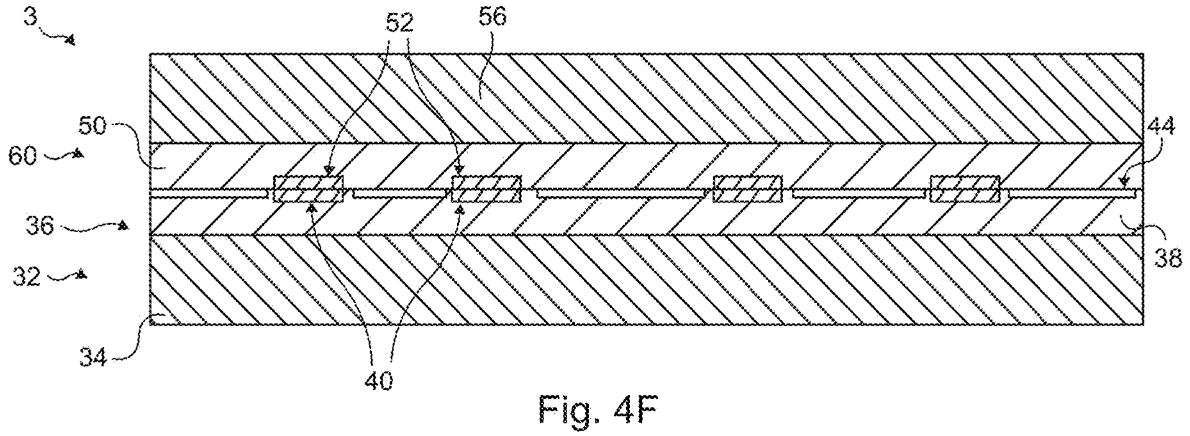
FIG. 4F is a schematic cross sectional side view of a bonded structure according to another embodiment.

FIG. 4F is a schematic cross sectional side view of the bonded structure 3 according to an embodiment. The bonded structure 3 can include the first element 32 and a second element 60. In some embodiments, the first element 32 can comprise a wafer and the second element 60 can comprise another wafer. The second element 60 can include a non-conductive field region 50, conductive features 52 spaced apart by at least a portion of the non-conductive field region 50, and a device portion 56. Portions of the non-conductive field region 50 of the second element 60 can be bonded to corresponding portions of the nonconductive field region 38 of the first element 32. The conductive features 52 of the second element 60 can be bonded to corresponding conductive features 40 of the first element 32. For example, the portions of the non-conductive field region 50 can be directly bonded to corresponding portions of the nonconductive field region 38 without an intervening adhesive, and the conductive features 52 can be directly bonded to corresponding conductive features 40 without an intervening adhesive.

The roughened surface 44 enables the portions of the non-conductive field region 50 and the corresponding portions of the nonconductive field region 38 to be directly bonded with a sufficient strength to enable direct hybrid bonding between the first and second elements 32, 60. In some embodiments, a bond strength between the non-conductive field region 50 and the nonconductive field region 38 can be in a range of, for example, 500 mJ/cm$^2$ to 1500 mJ/cm$^2$, 750 mJ/cm$^2$ to 1500 mJ/cm$^2$, 1000 mJ/cm$^2$ to 1500 mJ/cm$^2$, 500 mJ/cm$^2$ to 1250 mJ/cm$^2$, 500 mJ/cm$^2$ to 1000 mJ/cm$^2$, 500 mJ/cm$^2$ to 750 mJ/cm$^2$, 750 mJ/cm$^2$ to 1250 mJ/cm$^2$, or 750 mJ/cm$^2$ to 1000 mJ/cm$^2$.

In some embodiments, the second element 48, 60 can have a bonding surface that is the same as or generally similar to the bonding surface 42 of the first element 32. In some embodiments, the second element 48, 60 can have a bonding surface that is formed in the same or a generally similar method as those disclosed herein with respect to the first element 32. After the bonding operation, the bonded structure 3 can be thermally processed or annealed at a higher temperature or temperatures (150 to 400° C. between 10 miutes to up to 10 hours) to increase the bond strength of the bonded non-conductive interface region and the metallurgical bonding of the opposing respective conductive feature of elements 32, 60 in a suitable oven. The cooled bonded structure 3 may be singulated for other subsequent operations. For example, the singulation process may include coating the bonded structure 3 with a protective layer, mounting the coated bonded structure 3 on a dicing frame prior to singulation.

In the bonded structures 2, 3, the surface roughness of the first element 32 and the surface roughness of the second element 48, 60 can be inspected. For example, the surface roughnesses can be measured through a transmission electron microscopy (TEM) image of a bonding interface of a cross section of the bonded structure. In the TEM image a seam (e.g., a dielectric seam) may be observed between the bonded non-conductive field regions. The surface roughnesses of the non-conductive field regions 38, 50 may not significantly change before and after bonding.

The roughening process described with respect to FIGS. 4B-4D may be replaced with any suitable process to roughen the bonding surface 42. For example, FIGS. 5A, and 5B show an alternative or additional roughening processes.

Figure 5A:
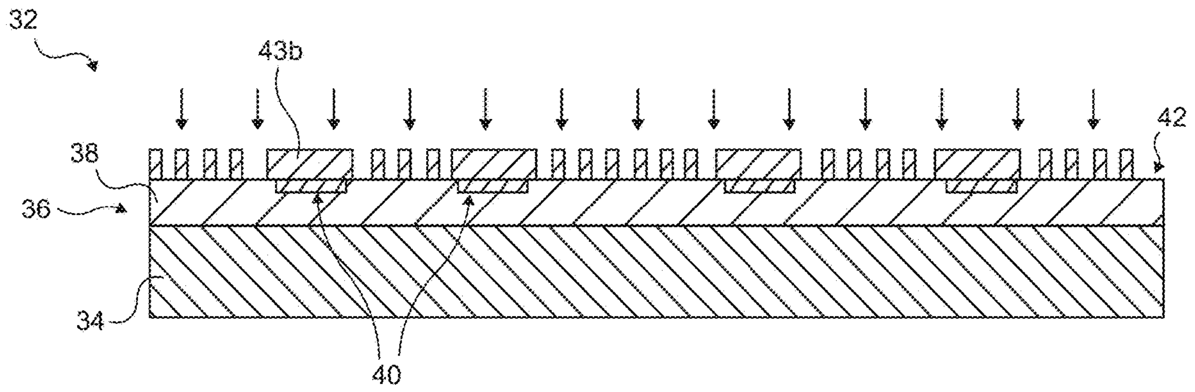
FIGS. 5A-5B illustrate steps in a method of forming a roughened surface according to another embodiment.

FIG. 5A is a schematic cross sectional side view of the first element 32 with patterned resist layer **43*b*. In some embodiments, portions of the non-conductive field region 38 that are not covered by the resist layer 43*b* can be roughened by way of an etching process, such as a wet etch or reactive ion etching (RIE). The arrows in FIG. 5A can represent flow of the etchant. Portions of the non-conductive field region 38 that are covered by the resist layer 43*b* can remain smooth, and the portions of the non-conductive field region 38 that are not covered by the resist layer 43*b* can be rough. In theory, keeping more smooth surface can provide a stronger bonding strength when the first element 32 is bonded to another element, as compared to a surface with more roughened surface. Therefore, the resulting bonding strength can be controlled at least in part by adjusting the areas of the bonding surface 42** to be roughened.

Figure 5B:
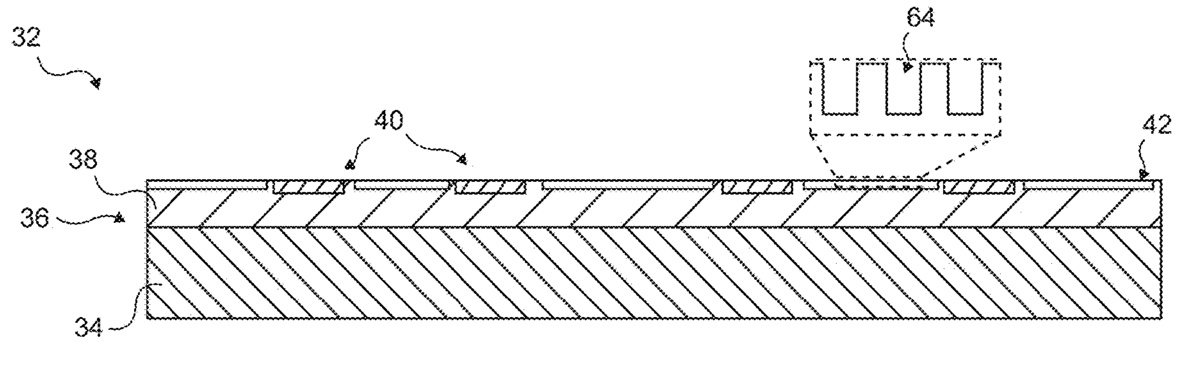

FIG. 5B shows the first element 32 with a roughened surface 64. The roughened surface 64 can have a surface roughness that is rougher than the surface roughness of the non-conductive field region 38 after polishing but before the roughening process. The roughness can be controlled by adjusting the intensity, chemistry, and/or duration of the roughening process. In some embodiments, the roughened surface 64 can have a surface roughness that is sufficiently smooth for a direct bonding. For example, the roughened surface 64 can have a surface roughness of at least 10 Å rms, at least 15 Å rms, or at least 20 Å rms, for example a surface roughness in a range of 6 Å rms to 100 Å rms, 6 Å rms to 60 Å rms, 10 Å rms to 40 Å rms, 10 Å rms to 100 Å rms, 10 Å rms to 60 Å rms, in a range of 6 Å rms to 500 Å rms, 6 Å rms to 200 Å rms, 10 Å rms to 200 Å rms, 25 Å rms to 200 Å rms, 30 Å rms to 200 Å rms, 35 Å rms to 200 Å rms, 50 Å rms to 200 Å rms, 100 Å rms to 200 Å rms, 6 Å rms to 100 Å rms, 6 Å rms to 25 Å rms, 25 Å rms to 100 Å rms, 35 Å rms to 100 Å rms, 55 Å rms to 200 Å rms, 55 Å rms to 100 Å rms, 75 Å rms to 200 Å rms, 75 Å rms to 100 Å rms, or 100 Å rms to 200 Å rms. In some embodiment, the depth of the roughened surface 64 with respect to a portion of the bonding surface 42 that is not roughened may range between 6 Å and 2000 Å, 10 Å and 1000 Å, or 20 Å and 200 Å, for example. A second element can be bonded to the first element 32 having the roughened surface 64.

In some embodiments, depending on the patterning, the bonding surface 42 of the non-conductive field region 38 can have smooth surface portions and roughened surface portions 64. Portions of the bonding surface 42 that are covered by the resist layer **43*b* can comprise the smooth surface portions (e.g., remaining portions of the polished bonding surface that have not been roughened). In some embodiments, a difference between the surface roughness of the smooth surface portions (e.g., polished surface portions) and the surface roughness of the roughened surface portions 64 can be at least 5 Å rms, 10 Å rms, 20 Å rms, 50 Å rms or 100 Å rms. For example, the bonding surface 42 can have smooth surface portions (e.g., polished portions) that have a surface roughness less than 15 Å rms, less than 10 Å rms, or less than 5 Å rms, and the roughened surface portions 64 can have a surface roughness greater than the surface roughness of the smooth surface, such as a surface roughness of at least 10 Å rms, at least 15 Å rms, or at least 20 Å rms, for example a surface roughness in a range of 6 Å rms to 60 Å rms, 10 Å rms to 40 Å rms, 10 Å rms to 100 Å rms, 10 Å rms to 60 Å rms, in a range of 6 Å rms to 500 Å rms, 6 Å rms to 200 Å rms, 10 Å rms to 200 Å rms, 25 Å rms to 200 Å rms, 30 Å rms to 200 Å rms, 35 Å rms to 200 Å rms, 50 Å rms to 200 Å rms, 100 Å rms to 200 Å rms, 6 Å rms to 100 Å rms, 6 Å rms to 25 Å rms, 25 Å rms to 100 Å rms, 35 Å rms to 100 Å rms, 55 Å rms to 200 Å rms, 55 Å rms to 100 Å rms, 75 Å rms to 200 Å rms, 75 Å rms to 100 Å rms, or 100 Å rms to 200 Å rms. In some embodiments, when the bonding surface 42 is patterned to have both the roughened surface portions 64 and the smooth surface portions, with the smooth surface portions bonding to the non-conductive field region 50 of the second element 48, 60, the majority of the bonding strength between the non-conductive field region 38 and the non-conductive field region 50** may be provided by the smooth surface portions.

In some embodiments, after a roughening process disclosed herein, a protective layer can be provided over the roughened surface and the resist layer 43*a*, 43*b*. For example, the protective layer can be provided to protect the element during a singulation process.

Figure 6A:
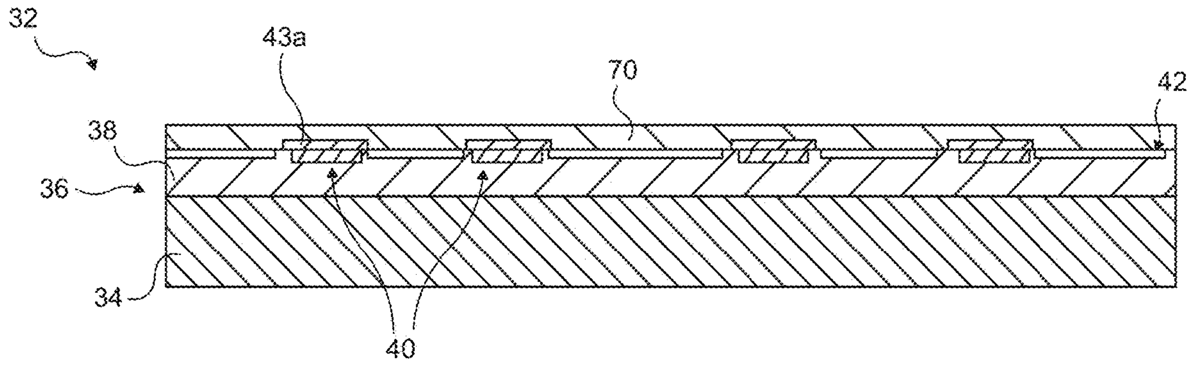
FIG. 6A is a schematic cross sectional side view of an element with a protective layer.

FIG. 6A is a schematic cross sectional side view of the first element 32 with a protective layer 70. The protective layer 70 can be provided (e.g., deposited) over the bonding surface 42 and the masking structure (e.g., the resist layer 43*a*). As described above, the resist layer 43*a* can be replaced with a suitable masking layer, such as a passivation layer. Though FIG. 6A shows the resist layer 43*a* which is selectively applied over contact features 40, in some other embodiments, the protective layer 70 may be provided over the bonding surface 42 and the resist layer 43*b* which is selectively applied over the contact features 40 and portions of the bonding surface 42 (see FIG. 5A).

In some embodiments, the protective layer 70 may comprise a material with a spin-on glass layer. The protective layer 70 can comprise an organic nonconductive material.

In some embodiments, the protective layer 70 may comprise multiple layers of different materials at different locations. For example, the protective layer 70 can have a first sub-protective over conductive features 40 and a second sub-protective layer roughened surface 44.

Figure 6B:
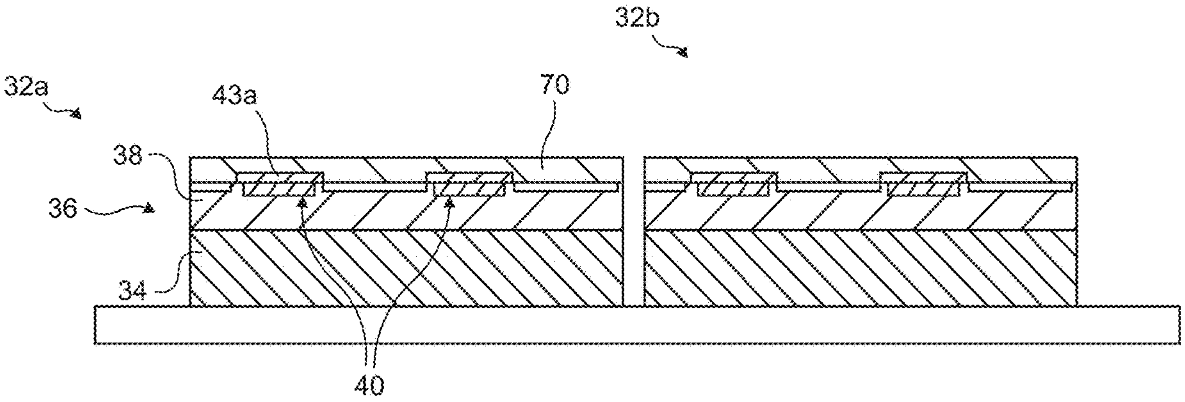
FIG. 6B is a schematic cross sectional side view of singulated elements with the protective layer.

In FIG. 6B, the element 32 can be singulated into a plurality of singulated elements 32*a*, 32*b* (e.g., singulated dies). In some embodiments, singulation can comprise a sawing process, a laser dicing, an etching process, or any other suitable processes.

Figure 6C:
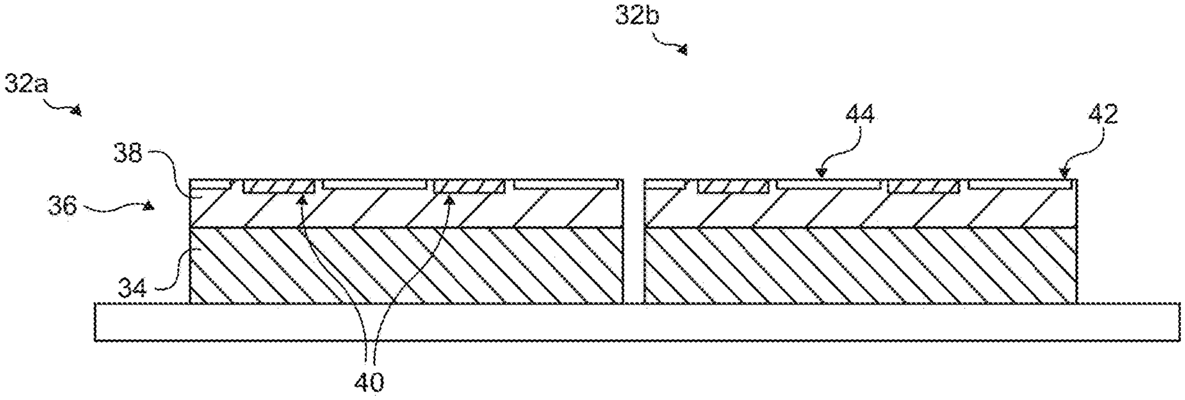
FIG. 6C is a schematic cross sectional side view of singulated elements of FIG. 6B without the protective layer.

In FIG. 6C, the protective layer 70 and the resist layer 43*a* can be removed (e.g., stripped) from the singulated elements 32*a*, 32*b*. In some embodiments, the protective layer 70 and the resist layer 43*a* can be removed simultaneously. After removal of the protective layer 70 and the resist layer 43*a*, the bonding surface 42 that comprises the roughened surface 44 and the conductive features 40 can be exposed. The singulated elements 32*a*, 32*b* can be bonded to another element in accordance with various embodiments disclosed herein.

In some embodiments, a second protective layer can replace the resist layer 43*a*. The protective layer 70 and the second protective layer can be provided after removing a masking structure (e.g., a photoresist layer and/or a passivation layer) for a roughening process. In some embodiments, the second protective layer can comprise an organic nonconductive material. In some embodiments, using a material with a low coefficient of thermal expansion may be advantageous in reducing the stress on the element 32. In some embodiments, the second protective layer 72 may comprise a porous material. The protective layer 70 and the second protective layer can protect the elements 32*a*, 32*b* during a singulation process. The protective layer 70 and the second protective layer can be removed (e.g., stripped) from the singulated elements 32*a*, 32*b*. In some embodiments, the protective layer 70 and/or the second protective layer can be removed simultaneously. After removal of the protective layer 70 and/or the second protective layer, the bonding surface 42 that comprises the roughened surface 44 and the conductive features 40 can be exposed. The singulated elements 32*a*, 32*b* can be bonded to another element in accordance with various embodiments disclosed herein.

In one aspect, a method of forming a bonded structure is disclosed. The method can include polishing a surface of a first element to form a polished surface, roughening at least a portion of the polished surface of the first element to form a bonding surface having a roughened surface (for example, having a surface roughness of at least 10 Angstroms rms), and directly bonding the bonding surface of the first element to a bonding surface of a second element.

In one embodiment, the first element includes a non-conductive field region and a conductive feature at the bonding surface. Polishing the surface can include polishing the non-conductive field region to a surface roughness of 6 Å rms or less. Roughening can include roughening a portion of the non-conductive field region to a surface roughness greater than 6 Å rms. The entire polished surface of the non-conducive field region can be roughened. The second element can include a non-conductive field region and a conductive feature. The non-conductive field region of the first element and the non-conductive field region of the second element can be directly bonded to one another without an intervening adhesive. The conducive feature of the first element and the conductive feature of the second element are directly bonded to one another without an intervening adhesive.

In one embodiment, the method further includes polishing a surface of the second element to define the bonding surface of the second element.

In one embodiment, the method further includes polishing a surface of the second element to define a polished surface of the second element, and roughening at least a portion of the polished surface of the second element to define the bonding surface of the second element that includes a roughened surface.

In one embodiment, roughening the portion of the polished surface comprises patterning a masking structure over the polished surface. The masking structure can include a photoresist layer or a passivation layer. The method can further include removing the masking structure. The method can further include providing a protective layer over the roughened surface of the first element. The method can further include singulating the first element into a plurality of singulated elements and removing the protective layer from the singulated elements.

In one embodiment, directly bonding includes initially contacting an edge portion of the bonding surface of the first element to the bonding surface of the second element such that the bonding surface of the first element is angled in a range of 1° to 15° relative to the bonding surface of the second element.

In one aspect, a method of forming a bonding surface for direct bonding is disclosed. The method can include providing an element having a polished surface including a non-conductive field region and a conductive feature, and roughening at least a portion of non-conductive field region of the polished surface.

In one embodiment, the method further includes polishing a surface of the element to form the polished surface.

In one embodiment, the polished surface has a surface roughness of 6 Å rms or less.

In one embodiment, roughening the portion of the non-conductive field region comprises forming a roughened surface having a surface roughness greater than 6 Å rms.

In one embodiment, the surface roughness of the roughened surface is in a range of 35 Å rms to 200 Å rms.

In one embodiment, the method further includes patterning a masking structure over the polished surface before roughening. The method can further include removing the masking structure after roughening. The method can further include providing a masking structure over the roughened surface of the first element. The masking structure can include a photoresist layer or a passivation layer.

In one aspect, a bonded structure is disclosed. The bonded structure can include a first element that includes a first non-conductive field region and a first conductive feature. The bonded structure can include a second element that includes a second non-conductive field region and a second conductive feature. The second element directly bonded to the first element along a bonding interface such that the first non-conductive field region is directly bonded to the second non-conductive field region without an intervening adhesive. The first conductive feature is directly bonded to the second conductive feature without an intervening adhesive. A first portion of the first non-conductive field region at the bonding interface has a first surface roughness, and a second portion of the first non-conductive field region at the bonding interface has a second surface roughness different from the first surface roughness.

In one embodiment, a difference between the first surface roughness and the second roughness is at least 20 Å rms.

In one embodiment, the first surface roughness of the first portion is in a range of 6 Å rms to 200 Å rms.

In one embodiment, the first surface roughness of the first portion is in a range of 20 Å rms to 200 Å rms.

In one embodiment, the second surface roughness of the second portion of the first non-conductive field region is less than 6 Å rms.

In one embodiment, the first element is a wafer or an integrated device die. The second element can be a wafer or an integrated device die.

In one aspect, a bonded structure is disclosed. The bonded structure can include a first element that includes a first non-conductive field region and a first conductive feature. The bonded structure can include a second element that includes a second non-conductive field region and a second conductive feature. The second element is directly bonded to the first element along a bonding interface such that the first non-conductive field region is directly bonded to the second non-conductive field region without an intervening adhesive. The first conductive feature is directly bonded to the second conductive feature without an intervening adhesive. At least a portion of the first non-conductive field region at the bonding interface has a surface roughness in a range of 35 Å rms to 200 Å rms.

In one embodiment, the surface roughness of the portion of the first non-conductive field region is in a range of 55 Å rms to 200 Å rms.

In one embodiment, the surface roughness of the portion of the first non-conductive field region is in a range of 100 Å rms to 200 Å rms.

In one embodiment, a surface roughness of a second portion of the first non-conductive field region is less than the surface roughness of the portion of the first non-conductive field region. The surface roughness of the second portion of the first non-conductive field region can be less than 6 Å rms.

In one embodiment, the first element is a wafer or an integrated device die. The second element can be a wafer or an integrated device die.

In one aspect, an element that is configured to bond to another element is disclosed. The element can include a non-conductive field region that has a surface at least partially defining a bonding surface. The surface of the non-conductive field region includes a first portion and a second portion. A first surface roughness of the first portion is different from a second surface roughness of the second portion. The element can include a conductive feature that is at least partially embedded in the nonconductive field region. The conductive feature has a surface at least partially defining the bonding surface. The bonding surface is configured to bond to another bonding surface of the other element without an intervening adhesive.

In one embodiment, a difference between the first surface roughness and the second roughness is at least 20 Å rms.

In one embodiment, the first surface roughness of the first portion is in a range of 6 Å rms to 200 Å rms.

In one embodiment, the first surface roughness of the first portion is in a range of 35 Å rms to 200 Å rms.

In one embodiment, the second surface roughness of the second portion of the first non-conductive field region is less than 6 Å rms.

In one embodiment, the first element is a wafer or an integrated device die. The second element can be a wafer or an integrated device die.

In one aspect, an element that is configured to bond to another element is disclosed. The element can include a non-conductive field region that has a surface at least partially defining a bonding surface. At least a portion of the surface of the non-conductive field region has a surface roughness in a range of 35 Å rms to 200 Å rms. The element can include a conductive feature proximate to the nonconductive field region. The conductive feature has a surface at least partially defining the bonding surface. The bonding surface is configured to bond to another bonding surface of the other element without an intervening adhesive.

In one embodiment, the surface roughness of the portion of the non-conductive field region is in a range of 55 Å rms to 200 Å rms.

In one embodiment, the surface roughness of the portion of the non-conductive field region is in a range of 100 Å rms to 200 Å rms.

In one embodiment, a surface roughness of a second portion of the surface of the non-conductive field region is less than the surface roughness of the portion of the first non-conductive field region. The surface roughness of the second portion of the first non-conductive field region is less than 6 Å rms.

In one embodiment, the first element is a wafer or an integrated device die. The second element is a wafer or an integrated device die.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of forming a bonded structure, the method comprising:
   - polishing a surface of a first element to form a polished surface;
   - roughening at least a portion of the polished surface of the first element to form a bonding surface having a roughened surface with a surface roughness of at least 10 Å rms, wherein roughening the portion of the polished surface comprises patterning a masking structure over the polished surface; and
   - directly bonding the bonding surface of the first element to a bonding surface of a second element.

2. The method of claim 1, wherein the first element comprises a non-conductive field region and a conductive feature at the bonding surface.

3. The method of claim 2, wherein polishing the surface comprises polishing the non-conductive field region to a surface roughness of 6 Å rms or less.

4. The method of claim 3, wherein roughening the portion of the polished surface comprises roughening a portion of the non-conductive field region to a surface roughness at least 20 Å rms.

5. The method of claim 2 wherein the second element comprises a non-conductive field region and a conductive feature, wherein the non-conductive field region of the first element and the non-conductive field region of the second element are directly bonded to one another without an intervening adhesive.

6. The method of claim 5, wherein the conducive feature of the first element and the conductive feature of the second element are directly bonded to one another without an intervening adhesive.

7. The method of claim 1, further comprising polishing a surface of the second element to define the bonding surface of the second element.

8. The method of claim 1, further comprising polishing a surface of the second element to define a polished surface of the second element, and roughening at least a portion of the polished surface of the second element to define the bonding surface of the second element.

9. The method of claim 1, wherein the masking structure comprises a photoresist layer or a passivation layer.

10. The method of claim 1, further comprising removing the masking structure.

11. The method of claim 10, further comprising providing a protective layer over the roughened surface of the first element.

12. The method of claim 11, further comprising singulating the first element into a plurality of singulated elements and removing the protective layer from the singulated elements.

13. The method of claim 11, wherein directly bonding includes initially contacting an edge portion of the bonding surface of the first element to the bonding surface of the second element such that the bonding surface of the first element is angled in a range of 1° to 15° relative to the bonding surface of the second element.

14. A method of forming a bonding surface for direct bonding, the method comprising:
   - providing an element having a polished surface including a non-conductive field region and a conductive feature;
   - patterning a masking structure over the polished surface; and
   - after patterning the masking structure, roughening at least a portion of non-conductive field region of the polished-surface.

15. The method of claim 14, further comprising polishing a surface of the element to form the polished surface.

16. The method of claim 14, wherein the polished surface has a surface roughness of 6 Å rms or less.

17. The method of claim 14, wherein roughening the at least a portion of the non-conductive field region comprises forming a roughened surface having a surface roughness greater than 10 Å rms.

18. The method of claim 17, wherein the surface roughness of the roughened surface is in a range of 35 Å rms to 200 Å rms.

19. The method of claim 14, further comprising removing the masking structure after roughening.

20. The method of claim 14, further comprising providing a masking structure over the roughened surface of the first element.

21. The method of claim 14, wherein the masking structure comprises a photoresist layer or a passivation layer.

* * * * *